United States Patent
Frankowsky

(10) Patent No.: US 7,483,326 B2
(45) Date of Patent: Jan. 27, 2009

(54) APPARATUS AND METHOD FOR MONITORING A STATE, IN PARTICULAR OF A FUSE

(75) Inventor: Gerd Frankowsky, Siegertsbrunn (DE) D-85635

(73) Assignee: Infineon Technologies AG, Munich (DE)

( * ) Notice: Subject to any disclaimer, the term of this patent is extended or adjusted under 35 U.S.C. 154(b) by 1452 days.

(21) Appl. No.: 10/374,916

(22) Filed: Feb. 26, 2003

(65) Prior Publication Data
US 2003/0174040 A1 Sep. 18, 2003

(30) Foreign Application Priority Data
Mar. 15, 2002 (DE) ............................... 102 11 571

(51) Int. Cl.
*G11C 17/18* (2006.01)
(52) U.S. Cl. ................ 365/225.7; 365/200; 365/189.07
(58) Field of Classification Search ............. 365/225.7, 365/200, 189.07, 189.011; 327/525–526
See application file for complete search history.

(56) References Cited

U.S. PATENT DOCUMENTS

| 3,544,777 A | 12/1970 | Winkler |
| 4,532,607 A * | 7/1985 | Uchida ........................ 365/96 |
| 5,083,293 A * | 1/1992 | Gilberg et al. ......... 365/189.16 |
| 5,258,953 A * | 11/1993 | Tsujimoto ................... 365/200 |
| 6,396,398 B1 | 5/2002 | Donat et al. |
| 6,473,862 B1 | 10/2002 | Givet |
| 6,618,637 B1 | 9/2003 | Kerner |
| 6,728,158 B2 * | 4/2004 | Takahashi et al. ........ 365/225.7 |

FOREIGN PATENT DOCUMENTS

| DE | 37 18582 A1 | 12/1987 |
| DE | 43 32 144 A1 | 3/1995 |
| DE | 198 02 728 A1 | 7/1999 |
| DE | 100 07 008 A1 | 9/2001 |
| DE | 100 37 737 A1 | 2/2002 |
| FR | 199 10 322 A1 | 9/1999 |
| FR | 2336451 A | 10/1999 |
| GB | 44 30 177 A1 | 3/1995 |

OTHER PUBLICATIONS

German Office Action dated Dec. 10, 2004.

* cited by examiner

*Primary Examiner*—Gene N. Auduong
(74) *Attorney, Agent, or Firm*—Patterson & Sheridan, L.L.P.

(57) ABSTRACT

The present invention provides an apparatus for monitoring a state, in particular of a fuse (4), having: a first state storage device (11) for storing a state, in particular of a fuse (4); a second state storage device (12) for storing the state of the first state storage device (11); and a logic device (9) for comparing the states of the two state stores (11, 12); the first state store (11) being able to be driven for renewed reading in of the state, in particular of the fuse (4), in the event of a noncorrespondence of the states in the two stores (11, 12). The present invention likewise provides a method for monitoring a state, in particular of a fuse.

13 Claims, 1 Drawing Sheet

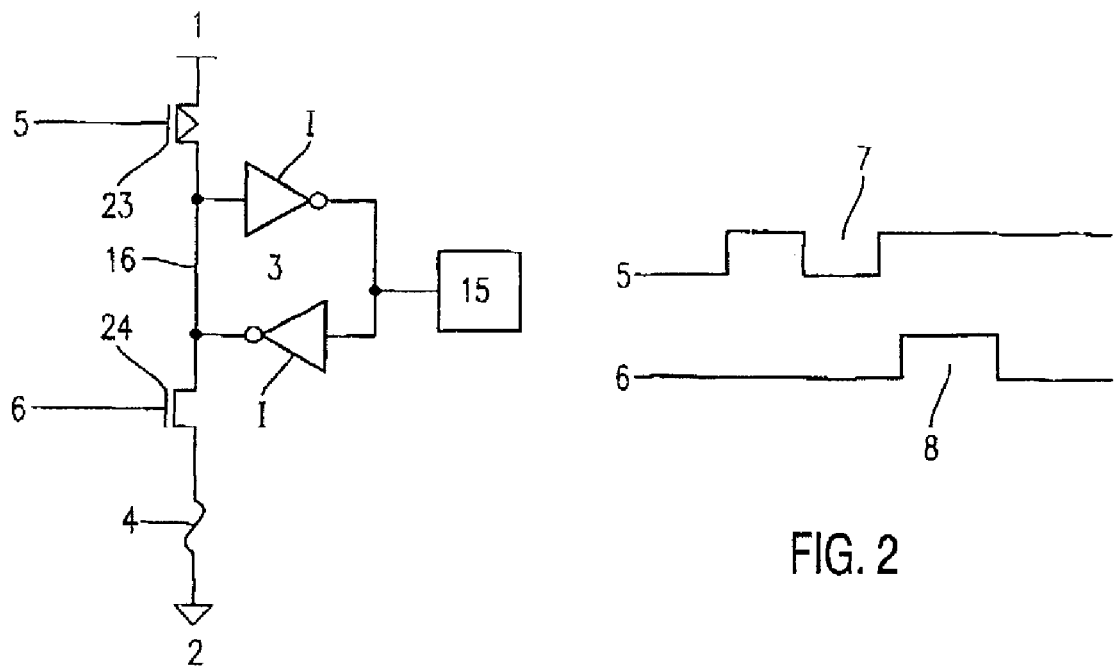
FIG. 1
FIG. 2
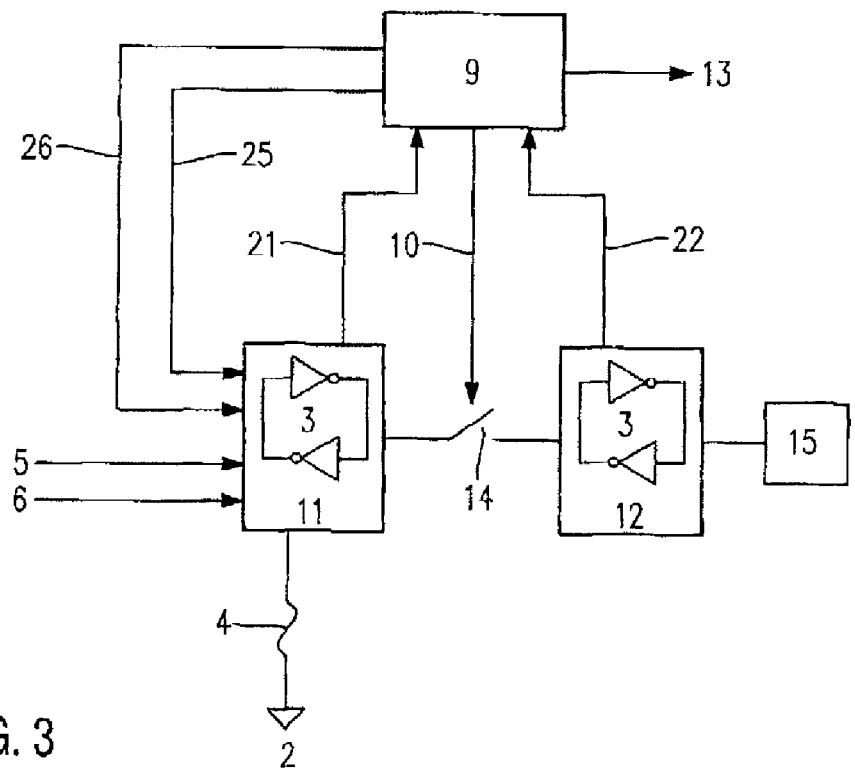
FIG. 3

APPARATUS AND METHOD FOR MONITORING A STATE, IN PARTICULAR OF A FUSE

TECHNICAL FIELD

The present invention relates to an apparatus and a method for monitoring a state, in particular of a fuse.

BACKGROUND ART

Latching fuse state storage circuits (fuse latch circuits) are used to store apparatus-relevant information, such as e.g. the state of a fuse, or repair information for memory chips. Latching fuse state stores (fuse latches) are exposed to the influence of errors that can be rectified, to a disturbance mechanism which is caused by particles, in particular α particles, which penetrate through the active state storage area and alter the state of the state store.

This represents a serious problem since the apparatus may be in operation for an indeterminate length of time and the error (incorrect stored state of the fuse to be monitored) is not corrected since the state stores (latches) are only set during the run-up or during the start of the apparatus. Module-relevant information, such as the repair information, is lost and cannot be recovered while the apparatus is active. Even more important is the fact that errors which [lacuna] by such state stores (latches) that have changed over unintentionally are difficult to detect. In present-day designs, the setting of the state store (set a fuse latch) is a "global" operation, which means that all the state stores (fuse latches) are set simultaneously. Therefore, it is not possible to refresh the state store information while the apparatus is active.

The problem has been alleviated hitherto by derating a state storage circuit (fuse latch circuit). This reduces the probability of an error occurring, but ultimately does not solve the problem.

FIG. 1 illustrates a customary state storage circuit. A supply voltage 1 (VDD) is connected via a first switching device 23, in particular a field-effect transistor, to an actual state store 3 (fuse latch), which has two inverters I. The first switching device 23 is actuated by a first drive signal 5 (FPUP). Via a connection 16, the first switching device 23 is connected to a second switching device 24, which is actuated by a second drive signal 6 (FPUN). Located between the second switching device 24 and a ground terminal 2 is the fuse 4 whose state is monitored by the circuit in accordance with FIG. 1. In parallel with the connection 16 between the first switching device 23 and the second switching device 24, the two inverters I are connected in series, between the two inverters a signal branching off to a detection device 15, in particular a decoding device.

FIG. 2 shows the drive signals 5, 6 plotted against time in order to elucidate the method of operation of the arrangement according to FIG. 1. The drive signal 5 (FPUP), which is applied to the first switching device 23, controls the resetting (reset) of the state store 3. After the run-up, a low level signal at the switching device 23 effects a resetting 7 (reset) of the state store 3 (latch). The second drive signal 6 (FPUN) controls the setting (set) of the state store 3 (latch), in which case, in the event of a high level signal at the second switching device 24, the state store 3 (latch) is set 8 (set latch) in accordance with the state of the fuse 4, which may be intact or blown. This operation is effected only once in each case after the activation of the apparatus during the run-up sequence in the event of a start-up.

SUMMARY OF THE INVENTION

It is an object of the present invention to provide an apparatus and a method for monitoring the state of a fuse which identifies, and in particular corrects, state storage devices (fuse latch) that have switched over unintentionally, without impeding the operation of the apparatus during the monitoring process.

According to the invention, this object is achieved by means of the apparatus specified in claim 1 and by means of the method according to claim 8.

The idea underlying the present invention consists in providing a second state storage device (e.g. fuse latch) and a state comparison/control logic.

In the present invention, the problem mentioned in the introduction is solved in particular by the states of two state storage devices (e.g. fuse latches) being compared in a comparison/control logic and, in the event of a noncorrespondence of the two states, a renewed checking of the state, e.g. of the fuse, being carried out with subsequent copying of the state acquired in the first state storage device into the second state storage device.

Advantageous developments and improvements of the respective subject matter of the invention are found in the subclaims.

In accordance with one preferred development, the first state store can be driven for reading in the state, in particular of the fuse, by the logic device.

In accordance with a further preferred development, the apparatus has a switching device, which can be driven by a copying signal for copying the state stored in the first storage device into the second storage device by the logic device.

In accordance with a further preferred development, the logic device can generate an error signal for indicating the noncorrespondence of the two states in the two storage devices.

In accordance with a further preferred development, the second state store is connected to one or more decoding devices.

In accordance with a further preferred development, the apparatus is used in a semiconductor memory device.

BRIEF DESCRIPTION OF THE DRAWINGS

Exemplary embodiments of the invention are illustrated in the drawings and are explained in more detail in the description below. In the figures:

FIG. 1 shows the circuit diagram of a customary state storage circuit (fuse latch circuit);

FIG. 2 shows the signal waveform of two drive signals for elucidating the method of operation of the arrangement according to FIG. 1; and FIG. 3 shows the block diagram of an apparatus for elucidating an embodiment of the present invention.

DETAILED DESCRIPTION OF THE INVENTION

In the figures, identical reference symbols designate identical or functionally identical constituent parts.

FIG. 3 shows the block diagram of an apparatus for monitoring the state of a fuse for elucidating an embodiment of the present invention.

FIG. 3 illustrates a first state storage device 11, which is connected to a ground terminal 2 (GND) via a fuse 4. A first drive signal 5 (FPUP) and a second drive signal 6 (FPUN) are applied to the first state storage device 11. Via a connection 21, the first state storage device 11 is connected to a logic device 9, which performs in particular comparison and control tasks (compare/control logic). A second state storage device 12 is likewise connected to the logic device 9 via a connection 22.

Located between the first state storage device 11 and the second state storage device 12 is a switching device 14, which is actuated according to the logic device 9. The first state storage device 11 (first fuse latch) essentially corresponds to the customary state storage device explained with reference to FIG. 1 and is used to detect the state of the fuse 4. However, instead of being connected directly to a decoding device 15 or a decoding circuit, as shown in FIG. 1, the first state storage device 11 can be connected to the second state storage device according to the switching device 14, the second state storage device (second fuse latch) being connected to the decoding device 15.

The switching device 14 allows the copying of the state stored in the first state storage device 11 into the second state storage device 12. The logic device 9 compares, in particular permanently, the contents of the two state storage devices 11, 12 and, in the case of a detected noncorrespondence of the two states in the state storage devices 11, 12, can cause, via the connections 25, 26, which, in particular, transmit signals whose signal waveform corresponds to that of the first and/or second drive signal 5, 6, the first state storage device 11 to check the state of the fuse 4 anew and to forward the newly generated storage content of the first state store 11 via the switching device 14 to the second state storage device 12 according to a copying signal 10, which issues from the logic device 9 to the switching device 14.

An error signal 13 (error) can be communicated to other circuit sections or systems (not illustrated) by the logic device 9. Such a disturbance, in particular the noncorrespondence of the two states which are stored in the two state storage devices 11, 12, occur [sic] as a result of the impinging of particles on the state storage areas, in particular as a result of the impinging of α particles.

According to the present invention, the state of the first state storage device 11 can be adjusted anew with the state of the fuse 4 to be monitored, without being superimposed with the operation of the apparatus, and can consequently serve as a reference. In the case of a detected noncorrespondence of the states of the two state storage devices 11, 12, it is initially not known whether the first or second state storage device 10 or 11 has an item of information that is corrupted, in particular by an α particle.

The detection of a noncorrespondence initiates a renewed checking of the state of the fuse 4 and a renewed storage of said state in the first state storage device 11, which is followed by a process of copying to the second state storage device 12. This process can take place locally and only for the state storage devices 11, 12 (fuse latches) which exhibit a noncorrespondence. This local process is advantageous since it reduces the influence of the state store update on the operation of the apparatus.

Such state storage devices are employed in particular in semiconductor memory devices.

Although the present invention has been described above essentially on the basis of a preferred exemplary embodiment, it is not restricted thereto, but rather can be modified in diverse ways.

Thus, e.g. the connections 16, 25, 26, 21, 22 between the individual apparatus units, such as, for example, the logic device 9 and a state storage device 11, 12, are not only conceivable as an electrical line but can also be realized optically.

Moreover, the invention is not restricted to the application possibilities mentioned (fuse latch stores or logic circuits), but rather can be applied to any desired circuits.

What is claimed is:

1. An apparatus for monitoring a state of a fuse, comprising:
   (a) a first state storage device for storing a state of the fuse;
   (b) a second state storage device for storing the state of the first state storage device; and
   (c) a logic device for comparing the states of the two state storage devices, the first state storage device being able to be driven for renewed reading of the state of the fuse in the event of a noncorrespondence of the states in the two storage devices.

2. The apparatus according to claim 1, wherein the first state storage device can be driven for reading in the state of the fuse by the logic device.

3. The apparatus as claimed in claim 1, wherein the apparatus has a switching device, which can be driven by a copying signal for copying the state stored in the first storage device into the second storage device by the logic device.

4. The apparatus according to claim 1, wherein the logic device can generate an error signal for indicating the noncorrespondence.

5. The apparatus according to claim 1, wherein the logic device accommodates at least one signal line which carries the drive signals which are also fed to the first state storage device.

6. The apparatus according to claim 1, wherein the second state storage device is connected to one or more decoding devices.

7. The apparatus according to claim 1, wherein the apparatus can be used in a semiconductor memory device.

8. A method for monitoring a state of a fuse, comprising:
   (a) storing a state of the fuse, in a first state storage device;
   (b) storing the state of the first state storage device in a second state storage device; and
   (c) comparing the states of the two state storage devices in a logic device wherein, in the event of a noncorrespondence of the states in the two storage devices, the first state storage device can be caused to effect renewed reading in of the state of the fuse.

9. The method according to claim 8, wherein the storage of the state of the fuse in the first state storage device is initiated by drive signals.

10. The method according to claim 8, wherein in a manner dependent on a copying signal, a switching device is actuated for copying a state from the first state storage device into the second state storage device.

11. The method according to claim 8, wherein in the event of a noncorrespondence of the states in the two state storage devices occurs, an error signal is generated by the logic device.

12. The method according to claim 8, wherein the creation of a copy of the state from the first state storage device in the second state storage device is performed locally in a manner restricted to the apparatus.

13. The method according to claim 8, wherein the method is performed on semiconductor memory devices.

* * * * *